US009379719B1

(12) United States Patent
Huang

(10) Patent No.: US 9,379,719 B1
(45) Date of Patent: Jun. 28, 2016

(54) PHASE LOCKED LOOP DEVICE

(71) Applicant: TAIWAN SEMICONDUCTOR MANUFACTURING CO., LTD., Hsinchu (TW)

(72) Inventor: Wen-Hung Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/674,579

(22) Filed: Mar. 31, 2015

(51) Int. Cl.
*H03L 7/06* (2006.01)
*H03L 7/081* (2006.01)
*H03L 7/093* (2006.01)

(52) U.S. Cl.
CPC .............. *H03L 7/0814* (2013.01); *H03L 7/093* (2013.01)

(58) Field of Classification Search
None
See application file for complete search history.

(56) References Cited

U.S. PATENT DOCUMENTS 9,209,958 B1* 12/2015 Palaskas ................ H04B 17/21
2012/0100821 A1* 4/2012 Dan ........................ H03L 7/099
455/269
2012/0161834 A1* 6/2012 Lee .......................... H03L 1/00
327/156
2016/0056827 A1* 2/2016 Vlachogiannakis . H03B 5/1265
327/158

OTHER PUBLICATIONS

Jingcheng Zhuang et al., 2014 Information Processing Society of Japan, Transactions on System LSI Design Methodology, vol. 7, 1-14, Feb. 2014.

* cited by examiner

*Primary Examiner* — Cassandra Cox
(74) *Attorney, Agent, or Firm* — Maschoff Brennan

(57) ABSTRACT

A device is disclosed that includes a control module and a gain estimation module. The control module is configured to superimpose two non-zero values on a frequency control word to respectively generate a first and a second modified fractional reference phase signals, under a condition that a fractional part of the frequency control word is smaller than a predetermined value. The gain estimation module is configured to calculate a first and a second estimated gain values respectively based on the first and the second modified fractional reference phase signals. The control module is further configured to calculate an estimated digital-to-time converter gain value based on an interpolation of the first and the second estimated gain values.

20 Claims, 4 Drawing Sheets

PHASE LOCKED LOOP DEVICE

FIELD OF THE INVENTION

The present disclosure relates to a phase locked loop technology. More particularly, the present disclosure relates to a phase locked loop device and method.

BACKGROUND

Electronic systems often include phase locked loop devices as a basic building block to stabilize a particular communication channel (e.g., operation with a particular frequency), to generate a signal, modulate or demodulate a signal, reconstitute a signal with less noise, or multiply or divide a frequency. Phase locked loop devices are frequently used in wireless communication, particularly where signals are carried with frequency, phase or amplitude modulation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
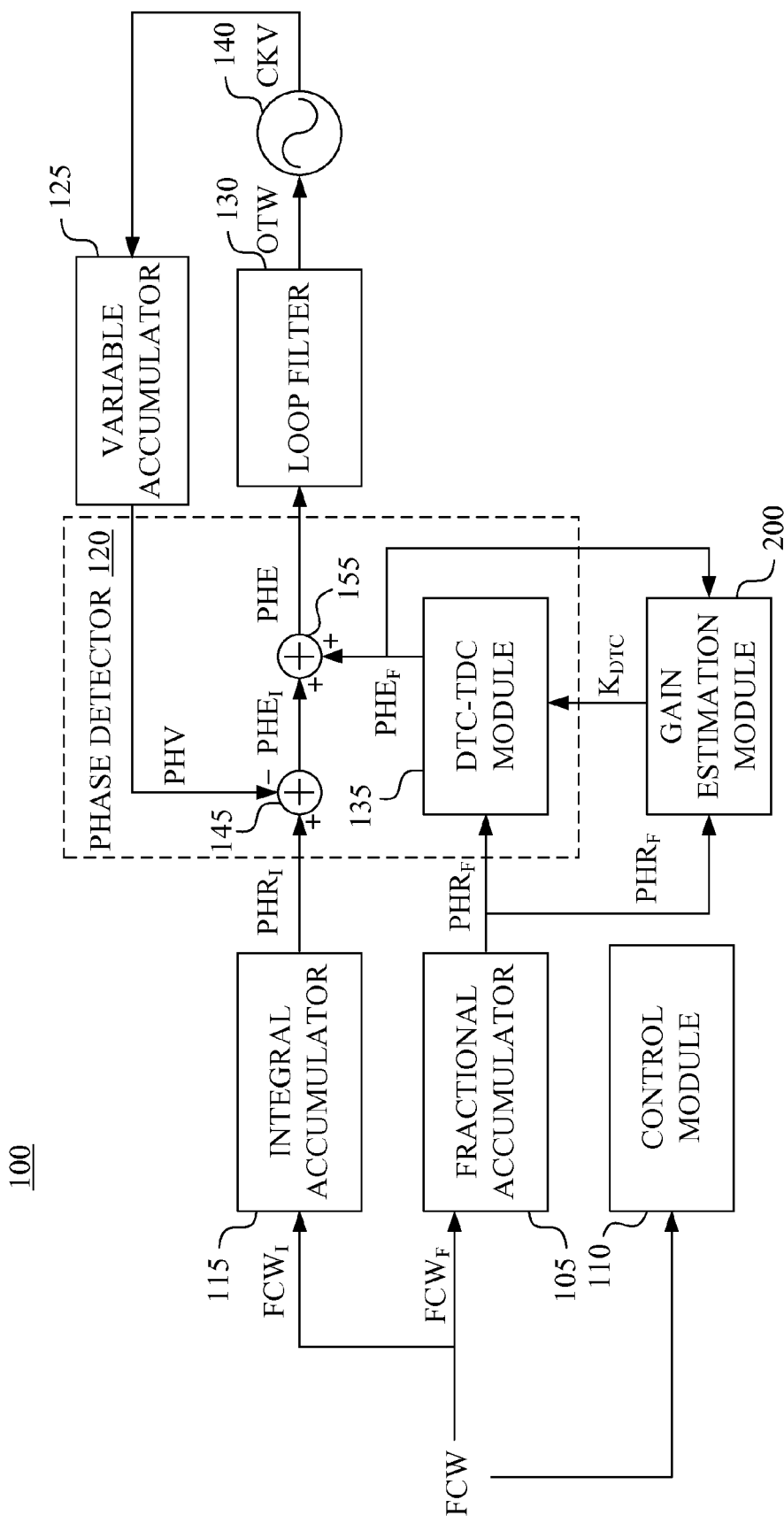
FIG. 1A is a block diagram of a phase locked loop device in accordance with various embodiments of the present disclosure.

The following disclosure provides many different embodiments, or examples, for implementing different features of the provided subject matter. Specific examples of components and arrangements are described below to simplify the present disclosure. These are, of course, examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1A is a block diagram of a phase locked loop device 100 in accordance with various embodiments of the present disclosure.

The phase locked loop device 100 operates according to a frequency control word FCW to generate an oscillating signal CKV such that the oscillating signal CKV is controlled and stabilized. For illustration, the frequency control word FCW is a ratio between a target frequency FTAR of the oscillating signal CKV and a reference frequency FREF of a reference clock signal (not illustrated). The frequency control word FCW is expressed as FCW=FTAR/FREF. For a numerical example, the FCW is 15.5. Under such a condition, there is 15.5 clock cycles of the oscillating signal CKV for each single cycle of FREF.

By detecting a phase difference between a reference phase of the reference clock signal and the phase of the oscillating signal CKV, the phase locked loop device 100 locks the oscillating signal CKV at the target frequency FTAR.

The phase locked loop device 100 includes a control module 110, a gain estimation module 200, a phase detector 120, a loop filter 130, a digital oscillator 140, a fractional accumulator 105, an integral accumulator 115 and a variable accumulator 125.

For illustration, the fractional accumulator 105 is configured to receive a fractional part $FCW_F$ of the frequency control word FCW. Moreover, the fractional accumulator 105 is configured to accumulate the fractional part $FCW_F$ of the frequency control word FCW to generate a fractional reference phase signal $PHR_F$.

For illustration, the integral accumulator 115 is configured to receive an integral part $FCW_I$ of the frequency control word FCW. Moreover, the integral accumulator 115 is configured to accumulate an integral part $FCW_I$ of the frequency control word FCW to generate an integral reference phase signal $PHR_I$.

The variable accumulator 125 is configured to receive the oscillating signal CKV. Moreover, the variable accumulator 125 is configured to accumulate a phase difference between the oscillating signal CKV and the reference clock signal having the reference frequency FREF to generate a variable phase error signal PHV.

The control module 110 is configured to receive the fractional part $FCW_F$ of the frequency control word FCW. Moreover, the control module 110 is configured to determine whether the fractional part $FCW_F$ of the frequency control word FCW is smaller than a predetermined value. For a numerical example, the predetermined value is 0.1. Various predetermined values are within the contemplated scope of the present disclosure.

When the control module 110 determines that the fractional part $FCW_F$ is not smaller than the predetermined value, the frequency control word FCW is determined to be under a non-integral condition. For illustration, the fractional part $FCW_F$ is large such that the frequency control word FCW is far from being an integer. For a numerical example, the frequency control word FCW is 15.5. Therefore, the integral part $FCW_I$ of the frequency control word FCW is 15 and the fractional part $FCW_F$ is 0.5. The value 0.5 of the fractional part $FCW_F$ is larger than the predetermined value having the value of 0.1 mentioned above. As a result, the frequency control word FCW having the value of 15.5 is determined to be under the non-integral condition.

The gain estimation module 200 is connected to the fractional accumulator 105 and is configured to receive the fractional reference phase signal $PHR_F$. Under the non-integral condition described above, the gain estimation module 200 is configured to calculate an estimated digital-to-time converter gain value $K_{DTC}$, according to the fractional reference phase signal $PHR_F$ and a feedback of a fractional phase error $PHE_F$ generated in the phase detector 120.

The phase detector 120 is electrically connected to the integral accumulator 115, the fractional accumulator 105 and the gain estimation module 200. For illustration, the phase detector 120 includes a digital-to-time and time-to-digital converter module (abbreviated as DTC-TDC module in FIG. 1) 135, an integral phase generator 145 and an adder 155.

For illustration, the digital-to-time and time-to-digital converter module 135 is connected to the fractional accumulator 105 and the gain estimation module 200. Moreover, the digital-to-time and time-to-digital converter module 135 is configured to receive the estimated digital-to-time converter gain value $K_{DTC}$ to calculate the fractional phase error $PHE_F$ of a phase error signal PHE based on the fractional reference phase signal $PHR_F$. In some embodiments, the fractional phase error $PHE_F$ is calculated based on the equation $PHE_F = 1 - \Delta Tr \times K_{DTC}$, wherein $\Delta Tr$ is a normalized cycle time. As a result, the accuracy of the fractional phase error $PHE_F$ depends on the accuracy of the estimated digital-to-time converter gain value $K_{DTC}$.

For illustration, the integral phase generator 145 is connected to the integral accumulator 115. Moreover, the integral phase generator 145 is configured to calculate an integral phase error $PHE_I$ of the phase error signal PHE according to a phase difference between the integral reference phase signal $PHR_F$ and the variable phase error signal PHV.

For illustration, the adder 155 is connected to the integral phase generator 145 and the digital-to-time and time-to-digital converter module 135. Moreover, the adder 155 is configured to combine the integral phase error $PHE_I$ and the fractional phase error $PHE_F$ to generate the phase error signal PHE. Alternatively stated, the phase error signal PHE includes the integral phase error $PHE_I$ calculated by the integral phase generator 145 and the fractional phase error $PHE_F$ calculated by the digital-to-time and time-to-digital converter module 135.

For illustration, the loop filter 130 is connected to the phase detector 120. More specifically, the loop filter is connected to the adder 155. The loop filter 130 is configured to generate a control signal OTW based on the phase error signal PHE. Though the detailed architecture of the loop filter 130 is not illustrated herein, various architectures of the loop filter 130 are within the contemplated scope of the present disclosure.

For illustration, the digital oscillator 140 is connected to the loop filter 130. Subsequently, the digital oscillator 140 is configured to generate the oscillating signal CKV based on the control signal OTW. Though the detailed architecture of the digital oscillator 140 is not illustrated herein, various architectures of the digital oscillator 140 are within the contemplated scope of the present disclosure.

Figure 1B:
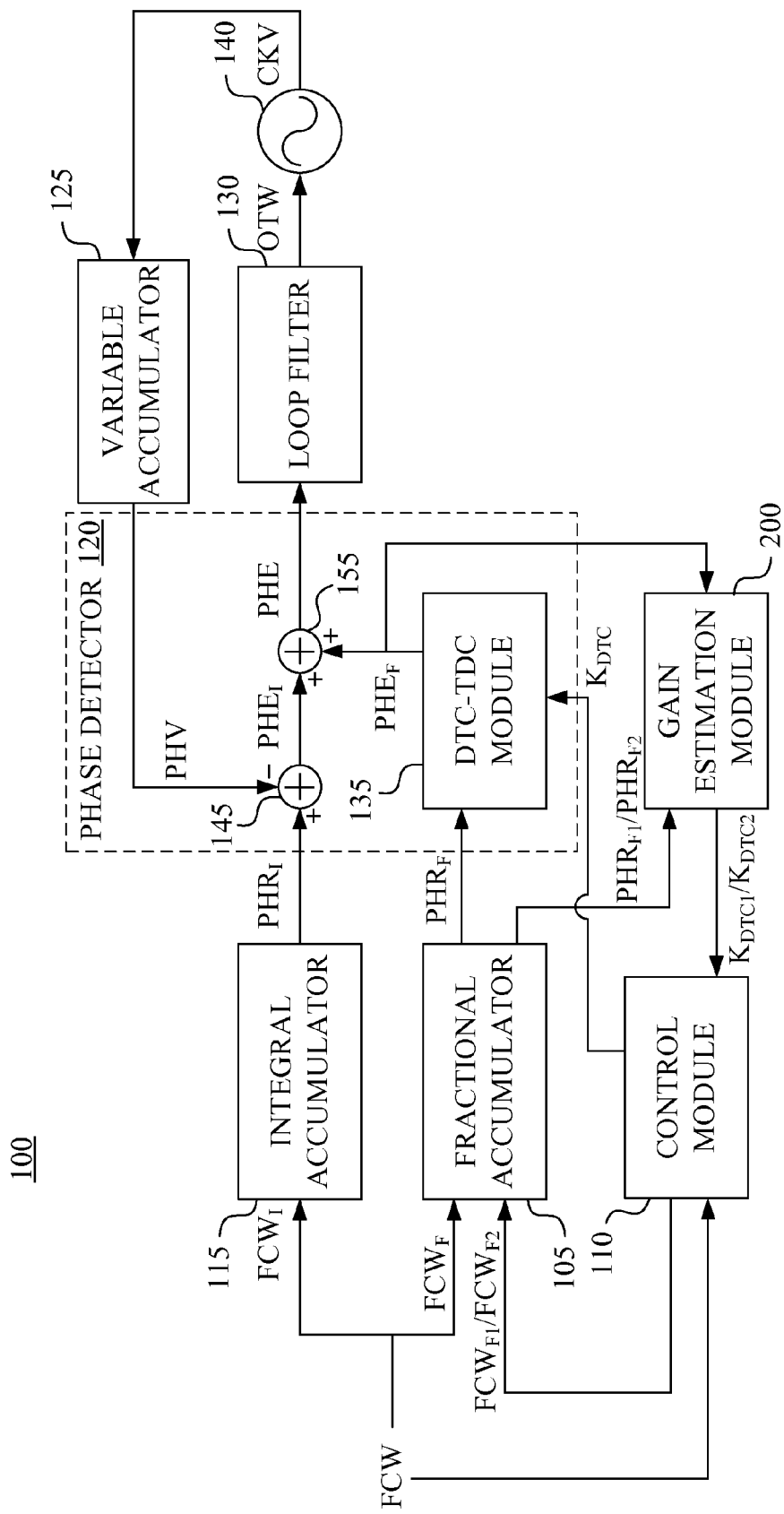
FIG. 1B is a block diagram of the phase locked loop device in accordance with various embodiments of the present disclosure.

FIG. 1B is a block diagram of the phase locked loop device 100 in accordance with various embodiments of the present disclosure.

When the control module 110 determines that the fractional part $FCW_F$ is smaller than the predetermined value, the frequency control word FCW is under a near-integral condition. Alternatively stated, the value of the frequency control word FCW approaches to an integer.

For illustration, the fractional part $FCW_F$ is close to zero, and the frequency control word FCW is substantially an integer. For a numerical example, the frequency control word FCW is 15.05. Therefore, the integral part $FCW_I$ of the frequency control word FCW is 15 and the fractional part $FCW_F$ is 0.05. The value 0.05 of the fractional part $FCW_F$ is smaller than the predetermined value having the value of 0.1 mentioned above. As a result, the frequency control word FCW having the value of 15.05 is determined to be under the near-integral condition.

Under the near-integral condition described above, the control module 110 superimposes two non-zero values on the frequency control word FCW to generate a modified fractional part $FCW_{F1}$ and a modified fractional part $FCW_{F2}$ accordingly. The term "superimpose" means that the control module 110 performs arithmetic operation such as addition and/or subtraction on the frequency control word FCW.

In some embodiments, the control module 110 adds a non-zero value to the fractional part $FCW_F$ to generate the modified fractional part $FCW_{F1}$. Furthermore, the control module 110 subtracts the other non-zero value from the fractional part $FCW_F$ to generate the modified fractional part $FCW_{F2}$. In some embodiments, the non-zero value added to the fractional part $FCW_F$ and the non-zero value subtracted from the fractional part $FCW_F$ are the same. In some embodiments, the non-zero value added to the fractional part $FCW_F$ and the non-zero value subtracted from the fractional part $FCW_F$ are different depending on different usage scenarios. Various combinations of non-zero values are within the contemplated scope of the present disclosure.

For a numerical example, the predetermined value is 0.1, the frequency control word FCW is 15, and the fractional part $FCW_F$ is 0. Therefore, the fractional part $FCW_F$ having the value 0 is smaller than the predetermined value having the value 0.1. As a result, the near-integral condition of the frequency control word FCW is met. Accordingly, the control module 110 is configured to add the non-zero value 0.25 to the frequency control word FCW having the value 15 to obtain a first modified frequency control word having the value of 15.25. Moreover, the control module 110 is configured to subtract the non-zero value 0.25 from the frequency control word FCW having the value 15 to obtain a second modified frequency control word having the value of 14.75.

As a result, a first modified fractional part $FCW_{F1}$ having the value of 0.25 is obtained according to the first modified frequency control word having the value of 15.25. A second modified fractional part $FCW_{F2}$ having the value of 0.75 is obtained according to the second modified frequency control word having the value of 14.75.

Subsequently, the fractional accumulator 105 is configured to generate the modified fractional reference phase signal $PHR_{F1}$ according to the modified fractional part $FCW_{F1}$. Furthermore, the fractional accumulator 105 is configured to generate the modified fractional reference phase signal $PHR_{F2}$ according to the modified fractional part $FCW_{F2}$.

The gain estimation module 200 calculates an estimated gain value $K_{DTC1}$ based on the modified fractional reference phase signal $PHR_{F1}$. Furthermore, the gain estimation module 200 calculates an estimated gain value $K_{DTC2}$ based on the modified fractional reference phase signal $PHR_{F2}$.

The control module 110 is configured to receive the estimated gain value $K_{DTC1}$ and the estimated gain value $K_{DTC2}$. Subsequently, the control module 110 is configured to further calculate an estimated digital-to-time converter gain value $K_{DTC}$ based on an interpolation of the estimated gain value $K_{DTC1}$ and the estimated gain value $K_{DTC2}$.

In some embodiments, the estimated digital-to-time converter gain value $K_{DTC}$ is calculated according to a weighted mean of the estimated gain value $K_{DTC1}$ and the estimated gain value $K_{DTC2}$. The two non-zero values are normalized as weighting factors for calculating the weighted mean. In some embodiments, the estimated digital-to-time converter gain value $K_{DTC}$ is calculated based on the estimated gain value $K_{DTC1}$ and the estimated gain value $K_{DTC2}$. For illustration, the estimated digital-to-time converter gain value $K_{DTC}$ is calculated by directly averaging the values of the estimated gain value $K_{DTC1}$ and the estimated gain value $K_{DTC2}$ no matter the two values are equal or not. Various calculation methods are within the contemplated scope of the present disclosure.

Figure 2:
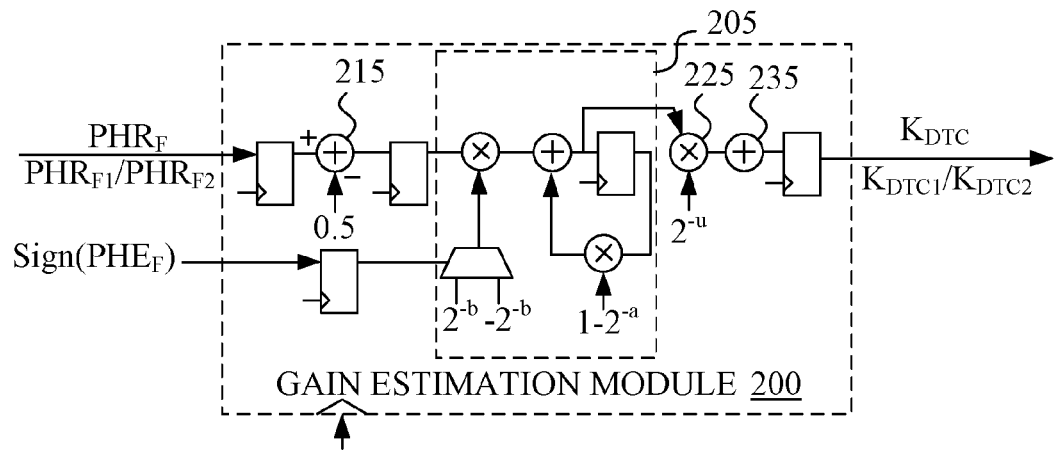
FIG. 2 is a circuit diagram of the estimation module in accordance with various embodiments of the present disclosure.

FIG. 2 is a circuit diagram of the gain estimation module 200 in accordance with various embodiments of the present disclosure.

In some embodiments, the gain estimation module 200 includes an infinite impulse response (IIR) filter 205 and a plurality of numerical operation units 215, 225 and 235, in order to perform a numerical operation. The estimated gain value $K_{DTC}$ under the non-integral condition and the estimated gain values $K_{DTC1}$ and $K_{DTC2}$ are calculated based on the same equation.

In some embodiments, for illustration of the estimated gain value $K_{DTC}$, the gain estimation module 200 calculates the estimated gain value $K_{DTC}$ based on a product of the fractional reference phase signal PHR and the sign of the fractional phase error PHE. More specifically, the gain estimation module 200 calculates the estimated gain value $K_{DTC}$ based on the following equation:

$K_{DTC} = \{(PHR_F[k]-0.5) \times Sign(PHE_F[k])\} \times 2^{-b} + u \times IIRout[k-1] \times (1-2^{-a})$, in which k is the number of iteration, $$Sign(PHE_F[k]) = \begin{cases} -1 : PHE_F[k] < 0 \\ 0 : PHE_F[k] = 0 \\ 1 : PHE_F[k] > 0 \end{cases}$$

and IIRout[k−1] is a number generated by the infinite impulse response filter 205.

Similarly, the gain estimation module 200 calculates the estimated gain value $K_{DTC1}$ based on the following equation: $K_{DTC1} = \{(PHR_{F1}[k]-0.5) \times Sign(PHE_F[k])\} \times 2^{-b} + u \times IIRout[k-1] \times (1-2^{-a})$.

The gain estimation module 200 calculates the estimated gain value $K_{DTC2}$ based on the following equation: $K_{DTC2} = \{(PHR_{F2}[k]-0.5) \times Sign(PHE_F[k])\} \times 2^{-b} + u \times IIRout[k-1] \times (1-2^{-a})$.

The detail circuit of the gain estimation module 200 illustrated in FIG. 2 is given for illustrative purposes. Various circuits are within the contemplated scope of the present disclosure.

Figure 3:
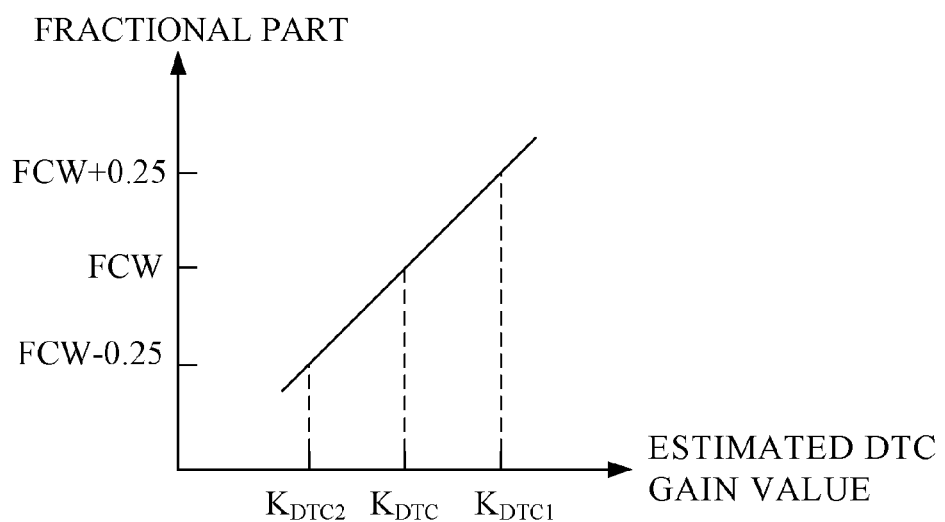
FIG. 3 is a diagram of the relation of the value of the fractional part and the estimated digital-to-time converter gain value in accordance with various embodiments of the present disclosure.

FIG. 3 is a diagram of the relation of the value of the frequency control word FCW and the estimated digital-to-time converter gain value $K_{DTC}$ in accordance with various embodiments of the present disclosure.

For illustration, the two non-zero values are the same, which are both, for example, 0.25. Accordingly, the normalized weighting factors for the estimated gain value $K_{DTC1}$ and the estimated gain value $K_{DTC2}$ both equal to 0.25/(0.25+0.25)=0.5. Under such a condition, the calculation of the estimated digital-to-time converter gain value $K_{DTC}$ is equivalent to the average of the estimated gain values $K_{DTC1}$ and $K_{DTC2}$. More specifically, the estimated digital-to-time converter gain value $K_{DTC}$ is equal to $(K_{DTC1}+K_{DTC2})/2$.

In some embodiments, the two non-zero values are different, and the normalized weighting factors are different accordingly. For example, when the value of the frequency control word FCW is 15 and the two non-zero values are 0.3 and 0.2, the value of the first modified frequency control word becomes 15.3 and the value of the second modified frequency control word becomes 14.8. The normalized weighting factor for the estimated gain value $K_{DTC1}$ becomes 0.3/(0.3+0.2)=0.6. The normalized weighting factor for the estimated gain value $K_{DTC2}$ becomes 0.2/(0.3+0.2)=0.4. The estimated digital-to-time converter gain value $K_{DTC}$ is equal to $0.6 \times K_{DTC1} + 0.4 \times K_{DTC2}$.

The non-zero values described above are given for illustrative purposes. Various values are within the contemplated scope of the present disclosure.

As described above, the accuracy of the fractional phase error $PHE_F$ depends on the accuracy of the estimated digital-to-time converter gain value $K_{DTC}$.

In some approaches, no matter what the frequency control word FCW is (e.g., under the near-integral condition or not), the estimated digital-to-time converter gain value $K_{DTC}$ is always calculated based on the fractional reference phase signal $PHR_F$. However, when the frequency control word FCW is under the near-integral condition, the fractional reference phase signal $PHR_F$ is close to zero. Accordingly, the calculation of the gain estimation module 200 takes a long time to converge or even does not converge. As a result, the calculation of the estimated digital-to-time converter gain value $K_{DTC}$ using these approaches is time-consuming, and is not accurate such that jitters occur in the oscillating signal CKV.

In the embodiments of the present disclosure, the superimposition of the two values results in two non-zero modified fractional parts $FCW_{F1}$ and $FCW_{F1}$, such as the values of 0.25 and 0.75 mentioned above. Accordingly, both the calculations of the estimated gain values $K_{DTC1}$ and $K_{DTC2}$ quickly converge as in the case of the non-integral condition, compared to the approaches mentioned above. Furthermore, after the interpolation of the estimated gain values $K_{DTC1}$ and $K_{DTC2}$, the estimated digital-to-time converter gain value $K_{DTC}$ is quickly obtained with great accuracy, compared to the approaches mentioned above.

For a numerical example with reference to FIG. 1A or FIG. 1B, when the phase locked loop device 100 operates at 3 gigahertz (GHz), and the delay time of the digital-to-time and time-to-digital converter module 135 is 15.6 picoseconds (ps), the frequency control word FCW is 15 and the reference frequency FREF of the reference clock signal is 200 megahertz. Parameters and results associated with the operation of the estimation module 110 are illustrated in the following Table 1.

TABLE 1

| FCW | Frequency (Megahertz) | Target period Tv (nanosecond) | $K_{DTC}$ | Simulation | Mismatch |
|---|---|---|---|---|---|
| 14.75 | 2950 | 0.338983 | 0.04602 | 0.0451 | 2.04% |
| 15 | 3000 | 0.333333 | 0.0468 | 0.04585 | 2.07% |
| 15.25 | 3050 | 0.327869 | 0.04758 | 0.0466 | 2.10% |

In Table 1, the estimated digital-to-time converter gain value $K_{DTC}$ having the value 0.0468 corresponds to the integer frequency control word FCW, i.e. 15. The final result shows that the mismatch of this estimated digital-to-time converter gain value $K_{DTC}$ is 2.07%.

In another numerical example, when the phase locked loop device 100 operates at 3 gigahertz, and the delay time of the digital-to-time and time-to-digital converter module 135 is 15.6 picoseconds, the frequency control word FCW is 24 and the reference frequency FREF of the reference clock signal is 50 megahertz. The final result shows that the calculation of the estimated digital-to-time converter gain value $K_{DTC}$ is improved by 300%.

Figure 4:
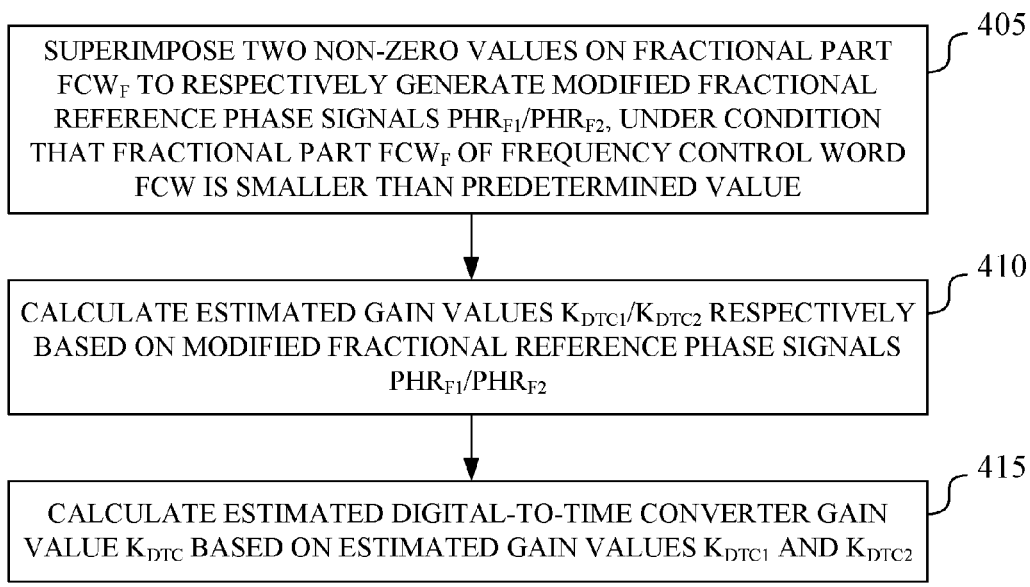
FIG. 4 is a flow chart of a method illustrating the operation of the phase locked loop device in accordance with various embodiments of the present disclosure.

FIG. 4 is a flow chart of a method 400 illustrating the operation of the phase locked loop device 100 in FIG. 1A and/or FIG. 1B, in accordance with various embodiments of the present disclosure. For illustration, the operation of the phase locked loop device 100 is described by the method 400 with reference to FIG. 1A and/or FIG. 1B.

With reference to the method 400 in FIG. 4, in operation 405, two non-zero values are superimposed on the fractional part $FCW_F$ to generate the modified fractional reference phase signals $PHR_{F1}$ and $PHR_{F2}$, respectively, under the condition that the fractional part $FCW_F$ of the frequency control word FCW is smaller than a predetermined value.

As described above, at first, the control module 110 determines whether the fractional part $FCW_F$ is smaller than the predetermined value. When the control module 110 determines that the fractional part $FCW_F$ is smaller than the predetermined value, the frequency control word FCW is determined to be under a near-integral condition.

Under the near-integral condition described above, the control module 110 superimposes two non-zero values on the frequency control word FCW to generate a modified fractional part $FCW_{F1}$ and a modified fractional part $FCW_{F2}$ accordingly. The term "superimpose" means that the control module 110 performs arithmetic operation such as addition and/or subtraction on the frequency control word FCW.

In some embodiments, the control module 110 adds a non-zero value to the fractional part $FCW_F$ to generate the modified fractional part $FCW_{F1}$. Furthermore, the control module 110 subtracts the other non-zero value from the fractional part $FCW_F$ to generate the modified fractional part $FCW_{F2}$.

Subsequently, the fractional accumulator 105 is configured to generate the modified fractional reference phase signal $PHR_{F1}$ according to the modified fractional part $FCW_{F1}$. Furthermore, the fractional accumulator 105 is configured to generate the modified fractional reference phase signal $PHR_{F2}$ according to the modified fractional part $FCW_{F2}$.

In operation 410, the estimated gain values $K_{DTC1}$ and $K_{DTC2}$ are calculated based on the modified fractional reference phase signals $PHR_{F1}$ and $PHR_{F2}$, respectively.

As described above, the gain estimation module 200 calculates an estimated gain value $K_{DTC1}$ based on the modified fractional reference phase signal $PHR_{F1}$. Furthermore, the gain estimation module 200 calculates an estimated gain value $K_{DTC2}$ based on the modified fractional reference phase signal $PHR_{F2}$. In some embodiments, the calculation of the estimated gain value $K_{DTC1}$ and the estimated gain value $K_{DTC2}$ is implemented by using the circuit illustrated in FIG. 2, in which the circuit includes the infinite impulse response filter 205 and the numerical operation units 215, 225 and 235, in order to perform a numerical operation. More specifically, in some embodiments, for illustration of the estimated gain value $K_{DTC}$, the gain estimation module 200 calculates the estimated gain value $K_{DTC}$ based on a product of the fractional reference phase signal PHR and the sign of the fractional phase error PHE.

In operation 415, the estimated digital-to-time converter gain value $K_{DTC}$ is calculated based on the estimated gain values $K_{DTC1}$ and $K_{DTC2}$.

As described above, the control module 110 is configured to receive the estimated gain value $K_{DTC1}$ and the estimated gain value $K_{DTC2}$. Subsequently, the control module 110 is configured to further calculate an estimated digital-to-time converter gain value $K_{DTC}$ based on an interpolation of the estimated gain value $K_{DTC1}$ and the estimated gain value $K_{DTC2}$.

In some embodiments, the estimated digital-to-time converter gain value $K_{DTC}$ is calculated according to a weighted mean of the estimated gain value $K_{DTC1}$ and the estimated gain value $K_{DTC2}$. The two non-zero values are normalized as weighting factors for calculating the weighted mean.

For a numerical example, the two non-zero values are the same, which are both, for example, 0.25. Accordingly, the normalized weighting factors for the estimated gain value $K_{DTC1}$ and the estimated gain value $K_{DTC2}$ both equal to $0.25/(0.25+0.25)=0.5$. Under such a condition, the calculation of the estimated digital-to-time converter gain value $K_{DTC}$ is equivalent to the average of the estimated gain values $K_{DTC1}$ and $K_{DTC2}$. More specifically, the estimated digital-to-time converter gain value $K_{DTC}$ is equal to $(K_{DTC1}+K_{DTC2})/2$.

In some approaches, no matter what the frequency control word FCW is (e.g., under the near-integral condition or not), the estimated digital-to-time converter gain value $K_{DTC}$ is always calculated based on the fractional reference phase signal $PHR_F$. However, when the frequency control word FCW is under the near-integral condition, the fractional reference phase signal $PHR_F$ is close to zero. Accordingly, the calculation of the gain estimation module 200 takes a long time to converge or even does not converge. As a result, the calculation of the estimated digital-to-time converter gain value $K_{DTC}$ using these approaches is time-consuming, and is not accurate such that jitters occur in the oscillating signal CKV.

In the embodiments of the present disclosure, the superimposition of the two values results in two non-zero modified fractional parts $FCW_{F1}$ and $FCW_{F1}$, such as the values of 0.25 and 0.75 mentioned above. Accordingly, both the calculations of the estimated gain values $K_{DTC1}$ and $K_{DTC2}$ quickly converge as in the case of the non-integral condition, compared to the approaches mentioned above. Furthermore, after the interpolation of the estimated gain values $K_{DTC1}$ and $K_{DTC2}$, the estimated digital-to-time converter gain value $K_{DTC}$ is quickly obtained with great accuracy, compared to the approaches mentioned above.

In some embodiments, a device is disclosed that includes a control module and a gain estimation module. The control module is configured to superimpose two non-zero values on a frequency control word to respectively generate a first and a second modified fractional reference phase signals, under a condition that a fractional part of the frequency control word is smaller than a predetermined value. The gain estimation module is configured to calculate a first and a second estimated gain values respectively based on the first and the second modified fractional reference phase signals. The control module is further configured to calculate an estimated digital-to-time converter gain value based on an interpolation of the first and the second estimated gain values.

Also disclosed is a method that includes the steps outlined below. Two non-zero values are superimposed on a frequency control word fractional part to respectively generate a first and a second modified fractional reference phase signals, under a condition that a fractional part of the frequency control word is smaller than a predetermined value. A first and a second estimated gain values are calculated respectively based on the first and the second modified fractional reference phase signals. An estimated digital-to-time converter gain value is calculated based on an interpolation of the first and the second estimated gain values.

Also disclosed is a device that includes a control module, a gain estimation module, a loop filter and a digital oscillator. The control module is configured to superimpose two non-zero values on a frequency control word to respectively generate a first and a second modified fractional reference phase signals, under a condition that a fractional part of the frequency control word is smaller than a predetermined value. The gain estimation module is configured to calculate a first and a second estimated gain values respectively based on the first and the second modified fractional reference phase signals, wherein the control module is further configured to calculate an estimated digital-to-time converter gain value based on an interpolation of the first and the second estimated gain values. The phase detector is configured to receive the estimated digital-to-time converter gain value to calculate a fractional phase error of a phase error signal. The loop filter is configured to generate a control signal based on the phase error signal. The digital oscillator is configured to generate an oscillating signal based on the control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a control module configured to superimpose two non-zero values on a frequency control word to respectively generate a first and a second modified fractional reference phase signals, under a condition that a fractional part of the frequency control word is smaller than a predetermined value; and
   a gain estimation module configured to calculate a first and a second estimated gain values respectively based on the first and the second modified fractional reference phase signals;
   wherein the control module is further configured to calculate an estimated digital-to-time converter (DTC) gain value based on an interpolation of the first and the second estimated gain values.

2. The device of claim 1, wherein the control module is configured to add a first non-zero value to the frequency control word to generate a first modified fractional part and perform an accumulating operation on the first modified fractional part to generate the first modified fractional reference phase signal, and to subtract a second non-zero value from the frequency control word to generate a second modified fractional part and perform the accumulating operation on the second modified fractional part to generate the second modified fractional reference phase signal.

3. The device of claim 2, wherein the control module is configured to calculate the estimated digital-to-time converter gain value according to a weighted mean of the first and the second estimated gain values, wherein the first non-zero value and second non-zero value are normalized as weighting factors.

4. The device of claim 3, wherein the first non-zero value and the second non-zero value are the same, and the control module is further configured to calculate the estimated digital-to-time converter gain value based on an average of the first and the second estimated gain values.

5. The device of claim 1, wherein under a condition that the fractional part is not smaller than the predetermined value, the gain estimation module is further configured to calculate an estimated gain value based on a fractional reference phase signal accumulated according to the fractional part and the control module is further configured to output the estimated gain value as the estimated digital-to-time converter gain value.

6. The device of claim 1, wherein the control module transmits the estimated digital-to-time converter gain value to a phase detector of a phase locked loop device to calculate a fractional phase error, wherein the gain estimation module calculates the first estimated gain value based on a product of the first modified fractional reference phase signal and a sign of the fractional phase error, and calculates the second estimated gain value based on a product of the second modified fractional reference phase signal and the sign of the fractional phase error.

7. A method, comprising:
   superimposing two non-zero values on a frequency control word fractional part to respectively generate a first and a second modified fractional reference phase signals, under a condition that a fractional part of the frequency control word is smaller than a predetermined value; and
   calculating a first and a second estimated gain values respectively based on the first and the second modified fractional reference phase signals; and
   calculating an estimated digital-to-time converter gain value based on an interpolation of the first and the second estimated gain values.

8. The method of claim 7, further comprising:
   adding a first non-zero value to the frequency control word to generate a first modified fractional part and performing an accumulating operation on the first modified fractional part to generate the first modified fractional reference phase signal, and subtracting a second non-zero value from the frequency control word to generate a second modified fractional part and performing the accumulating operation on the second modified fractional part to generate the second modified fractional reference phase signal.

9. The method of claim 8, further comprising:
calculating the estimated digital-to-time converter gain value according to a weighted mean of the first and the second estimated gain values, wherein the first non-zero value and second non-zero value are normalized as weighting factors.

10. The method of claim 9, wherein the first value and the second value are the same, and the control module calculates the estimated digital-to-time converter gain value based on an average of the first and the second estimated gain values.

11. The method of claim 7, further comprising:
calculating an estimated gain value based on a fractional reference phase signal accumulated according to the fractional part under a condition that the fractional part is not smaller than the predetermined value; and
outputting the estimated gain value as the estimated digital-to-time converter gain value.

12. The method of claim 7, further comprising:
transmitting the estimated digital-to-time converter gain value to a phase detector of a phase locked loop device to calculate a fractional phase error, wherein the gain estimation module calculates the first estimated gain value based on a product of the first modified fractional reference phase signal and a sign of the fractional phase error, and calculates the second estimated gain value based on a product of the second estimated gain value and the sign of the fractional phase error.

13. A device, comprising:
a control module configured to superimpose two non-zero values on a frequency control word to respectively generate a first and a second modified fractional reference phase signals, under a condition that a fractional part of the frequency control word is smaller than a predetermined value;
a gain estimation module configured to calculate a first and a second estimated gain values respectively based on the first and the second modified fractional reference phase signals, wherein the control module is further configured to calculate an estimated digital-to-time converter gain value based on an interpolation of the first and the second estimated gain values;
a phase detector configured to receive the estimated digital-to-time converter gain value to calculate a fractional phase error of a phase error signal;
a loop filter configured to generate a control signal based on the phase error signal; and
a digital oscillator configured to generate an oscillating signal based on the control signal.

14. The device of claim 13, wherein the control module is configured to add a first non-zero value to the frequency control word to generate a first modified fractional part and perform an accumulating operation on the first modified fractional part to generate the first modified fractional reference phase signal, and to subtract a second non-zero value from the frequency control word to generate a second modified fractional part and perform the accumulating operation on the second modified fractional part to generate the second modified fractional reference phase signal.

15. The device of claim 14, wherein the control module is configured to calculate the estimated digital-to-time converter gain value according to a weighted mean of the first and the second estimated gain values, wherein the first non-zero value and second non-zero value are normalized as weighting factors.

16. The device of claim 15, wherein the first non-zero value and the second non-zero value are the same, and the control module is further configured to calculate the estimated digital-to-time converter gain value based on an average of the first and the second estimated gain values.

17. The device of claim 13, wherein the gain estimation module is further configured to calculate the first estimated gain value based on a product of the first modified fractional reference phase signal and a sign of the fractional phase error, and is further configured to calculate the second estimated gain value based on a product of the second estimated gain value and the sign of the fractional phase error.

18. The device of claim 13, wherein the phase detector comprises a digital-to-time and time-to digital converter module configured to receive the estimated digital-to-time converter gain value and a fractional reference phase signal accumulated according to the fractional part of the frequency control word to calculate the fractional phase error of the phase error signal.

19. The device of claim 13, wherein the phase detector comprises an integral phase generator configured to calculate an integral phase error of the phase error signal according to a phase difference between an integral reference phase signal accumulated according to an integral part of the frequency control word and a variable phase error signal accumulated according to a phase difference between the oscillating signal and a reference clock signal.

20. The device of claim 19, wherein the frequency control word is a ratio between a target frequency of the oscillating signal and a frequency of the reference clock signal.

* * * * *